(12) United States Patent
Kareenahalli et al.

(10) Patent No.: US 7,239,254 B1
(45) Date of Patent: Jul. 3, 2007

(54) PROGRAMMABLE MULTI-CYCLE SIGNALING IN INTEGRATED CIRCUITS

(75) Inventors: Suryaprasad Kareenahalli, Folsom, CA (US); Zohar Bogin, Folsom, CA (US); Chee Hak Teh, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/394,510

(22) Filed: Mar. 31, 2006

(51) Int. Cl.
*H03M 9/00* (2006.01)

(52) U.S. Cl. .................................... 341/100
(58) Field of Classification Search ............... 341/100, 341/101
See application file for complete search history.

(56) References Cited

U.S. PATENT DOCUMENTS

| | | | | |
|---|---|---|---|---|
| 5,107,264 A | * | 4/1992 | Novof | 341/101 |
| 5,134,702 A | * | 7/1992 | Charych et al. | 710/71 |
| 6,184,808 B1 | * | 2/2001 | Nakamura | 341/95 |
| 6,806,819 B2 | * | 10/2004 | Hoffmann | 341/100 |

\* cited by examiner

*Primary Examiner*—Brian Young
(74) *Attorney, Agent, or Firm*—LeMoine Patent Services, PLLC; Dana B. LeMoine

(57) ABSTRACT

A programmable multi-cycle signaling scheme provides synchronous communications over relatively large distances. An input digital data stream is de-multiplexed onto multiple conductors. The digital data stream is recreated at the far end of the conductors.

24 Claims, 12 Drawing Sheets

_US 7,239,254 B1_

PROGRAMMABLE MULTI-CYCLE SIGNALING IN INTEGRATED CIRCUITS

FIELD

The present invention relates generally to integrated circuits, and more specifically to signaling over relatively large distances in integrated circuits.

BACKGROUND

Integrated circuits typically include signal paths, or "conductors" upon which signals are transmitted. Signals take a finite amount of time to propagate along a conductor. This time is referred to herein as "propagation delay." Propagation delay of a conductor may be influenced by many factors. For example, propagation delays may be influenced by the physical dimensions of a conductor, electrical properties of the conductor, environmental factors such as temperature, and the like.

FIG. 1 shows a prior art integrated circuit. Integrated circuit 100 includes sequential elements 110 and 112 coupled by conductor 114. Clock distribution circuit 120 provides a clock signal CLK1 to sequential element 110, and also provides a clock signal CLK2 to sequential element 112. Clock distribution circuit 120 typically includes matched circuits to distribute CLK1 and CLK2 as closely phase-matched as possible.

Propagation delay "$t_{pd}$" describes the amount of time it takes for a signal to propagate along conductor 114 between sequential element 110 and sequential element 112. Synchronous communications can take place between sequential element 110 and sequential element 112 as long as the propagation delay of conductor 114 is less than the period of clock signals CLK1 and CLK2. As clock signals increase in frequency, and as propagation delays increase due to larger integrated circuits, propagation delays may become larger than the clock period, introducing errors in the synchronous communications.

DESCRIPTION OF EMBODIMENTS

Figure 1:
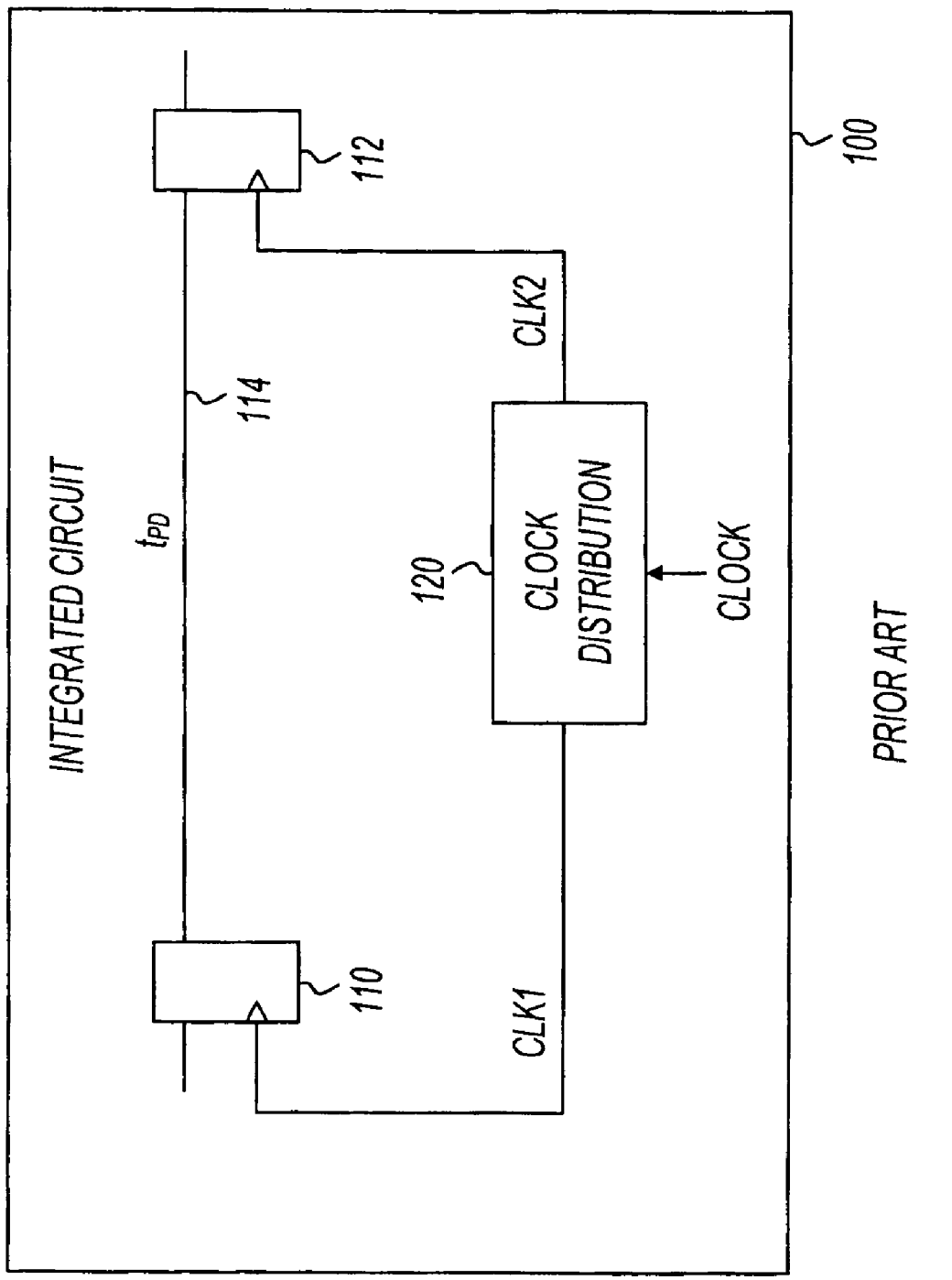
FIG. 1 shows a prior art integrated circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
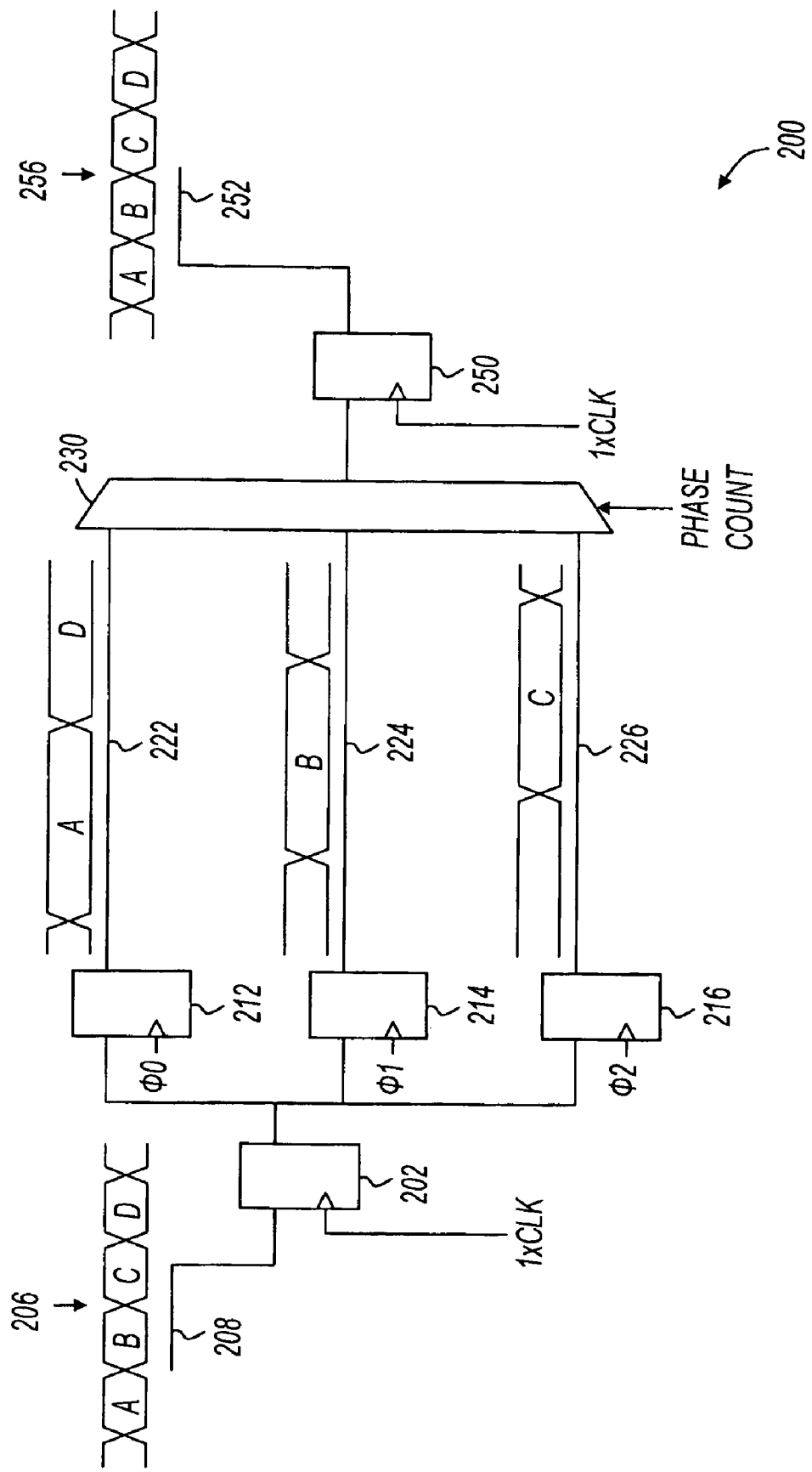
FIG. 2 shows a circuit using a multi-cycle signaling scheme.

FIG. 2 shows a circuit using a multi-cycle signaling scheme. Circuit 200 includes sequential elements 202 and 250, which communicate synchronously at a frequency provided by clock signal 1xCLK. Sequential element 202 receives synchronous digital data 206 on node 208, and synchronous element 250 reproduces a copy of digital data stream 206 as digital data stream 256 on node 252.

The frequency of clock signal 1xCLK determines the digital data rate of digital data streams 206 and 256. In some embodiments, circuit 200 is included within a large integrated circuit, and the physical distance between sequential elements 202 and 250 is such that direct synchronous communications cannot be reliably maintained at the frequency of clock signal 1xCLK. For example, propagation delays of conductors between sequential elements 202 and 250 may be longer than a clock period of 1xCLK.

Sequential elements 212, 214, and 216, and multiplexer 230 provide for a multi-cycling signaling scheme that allows reliable synchronous communications between sequential elements 202 and 250 at the frequency of 1xCLK. For example, sequential elements 212, 214, and 216 each receive the output of sequential element 202, and each is clocked by a different phase control signal (Φ0, Φ1, Φ2), producing signals as shown on conductors 222, 224, and 226. By clocking sequential elements 212, 214, and 216 with different phased signals, the digital data stream 206 is de-multiplexed onto multiple conductors 222, 224, and 226. Each of the signals appearing on the multiple conductors has a period longer than the period 1xCLK. In the example embodiment of FIG. 2, digital data stream 206 is de-multiplexed into three separate multi-cycle data streams, and each of the multi-cycle data streams has a period that is three times as long as the period of digital data stream 206. The data streams on conductors 222, 224, and 226 are referred to herein as "multi-cycle" because each has a period, or "cycle," that a multiple of the period of the original digital data stream 206. In the example of FIG. 2, the each data stream on conductors 222, 224, and 226 has a cycle three times as long as the cycle of the original digital data stream.

Multiplexer 230 multiplexes the multi-cycle signals to the input of sequential element 250, which is clocked by 1xCLK, thereby recreating the digital data stream 256 on node 252. Multiplexer steers the multi-cycles to sequential element 250 in response to a "phase count" represented by a signal labeled "PHASE COUNT" in FIG. 2. In the example embodiments represented by FIG. 2, the phase count signal is a signal that repeatedly counts through three values to steer multiplexer 230. In some embodiments, the phase count is also used to create the phase control signals Φ0, Φ1, and Φ2. The phase count and phase control signals are described further below with reference to later figures.

Circuit 200 is shown with three parallel conductors each having a multi-cycle signal with a period that is three times the period of the initial data stream. In some embodiments, "N" parallel conductors are used and each multi-cycle signal has a period that is "N" times as large as the period of the original digital data stream. The number of parallel conductors in any given embodiment may be chosen based on the maximum possible frequency of clock signal 1xCLK, the propagation delay of the parallel conductors, and other factors.

Sequential elements 212, 214, and 216 are shown as flip-flops, although this is not a limitation of the present invention. For example, sequential elements 212, 214, and 216 may be level sensitive latches, or any other sequential element capable of holding data for a particular amount of time. Further, the different phase clock signals clocking sequential elements 212, 214, and 216, may be generated in many different ways, and may have different periods based at least in part on what type of sequential element is being driven.

Sequential elements 212, 214, and 216 produce multi-cycle signals on parallel conductors in response to phase control signals. This operation is referred to herein as "phase-based signal insertion." The operation of phase-based signal insertion de-multiplexes a digital data stream into multiple multi-cycle digital data streams where different data values are inserted in the multi-cycle data streams based on the phase characteristics of the phase control signals Φ0, Φ1, and Φ2. Similarly, the operation of multiplexer 230 is referred to herein as "phase-based signal decode." Based on the characteristics of the phase count, multiplexer 230 selects the different multi-cycle digital data streams and provides them to sequential element 250.

In some embodiments, the relative timing of circuit 200 is modifiable by modifying the timing of the phase control signals clocking sequential 212, 214, and 216, and by modifying the PHASE COUNT signal controlling multiplexer 230. Further, in some embodiments, relative timing may be made programmable through configuration information stored in registers. Various embodiments of programmable multi-cycle signaling are described further with reference to the following figures.

Figure 3:
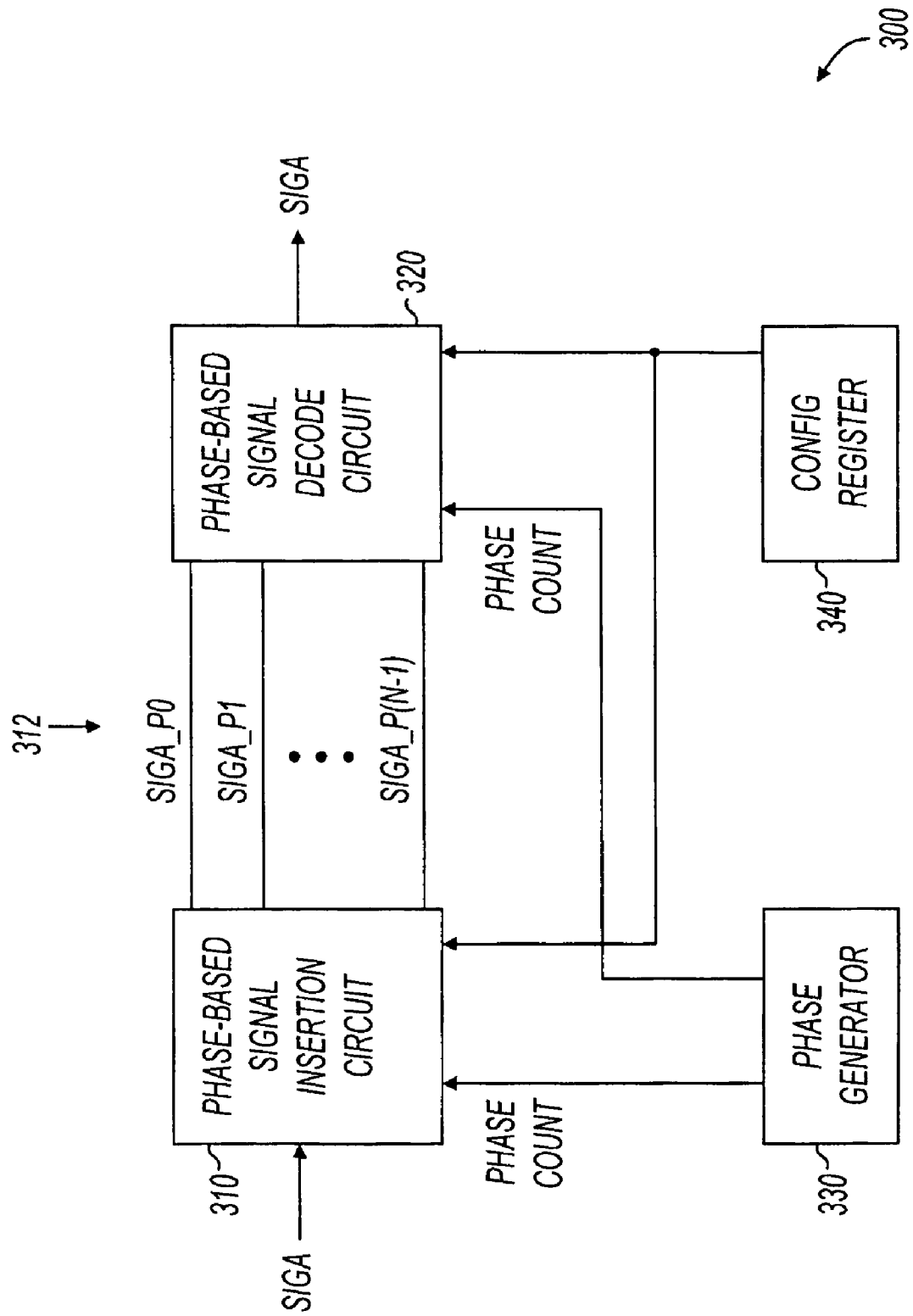
FIG. 3 shows a circuit utilizing programmable multi-cycle signaling.

FIG. 3 shows a circuit utilizing programmable multi-cycle signaling. Circuit 300 includes phase-based signal insertion circuit 310, phase-based signal decode circuit 320, phase generator 330, and configuration register 340. Phase-based signal insertion circuit 310 receives a signal shown as SIGA, and provides "N" multi-cycle signals shown as SIGA_P0 to SIGA(N−1) at 312. Further, phase-based signal decode circuit 320 receives multi-cycle signals 312 and reproduces the original signal SIGA.

In operation, phase-based signal insertion circuit 310 performs a function similar to the functions of sequential elements 202, 212, 214, and 216 (FIG. 2). Further, phase-based signal decode circuit 320 performs a function similar to multiplexer 230 and sequential element 250 (FIG. 2).

Circuit 300 also includes phase generator 330. Phase generator 330 keeps track of the phase count and produces multiple PHASE COUNT signals that are in phase with each other. As shown in FIG. 3, phase generator 330 produces two PHASE COUNT signals to provide to phase-based signal insertion circuit 310 and phase-based signal decode circuit 320. In some embodiments, phase generator 330 may be part of a phase locked loop. Further, in some embodiments, phase generator 330 may be distributed about an integrated circuit die. Example embodiments of phase generator 330 are described below with reference to FIGS. 4 and 5.

Configuration register 340 may include information that may be programmed to influence the operation of phase-based signal insertion circuit 310 and phase-based signal decode circuit 320. For example, referring now back to FIG. 2, configuration register 340 may hold information that modifies the relative phases of phase control signals Φ0, Φ1, and Φ2. Configuration register 340 may also hold configuration bits to control the granularity with which phase-based signal decode circuit can capture the multi-cycle data. This is described more fully below with respect to FIGS. 7-9.

In some embodiments, the information in configuration register 340 is "programmed" based on an operating frequency of the integrated circuit. For example, a particular integrated circuit may be able support different clock frequencies, and configuration register 340 may include a programmable word that is to be programmed with different values based on the operating frequency. The phase relationship of the phase control signals may be modified in response to the programmable word.

Circuit 300 is shown providing a programmable multi-cycle signaling scheme for a single digital data stream, SIGA. In various embodiments of the present invention many such multi-cycle signaling schemes are provided within an integrated circuit. For example, a large integrated circuit may have a number of synchronous signals that travel a long distance on the integrated circuit die at a high frequency. In these embodiments, each signal may be de-multiplexed onto multiple parallel conductors, where each conductor carries a multi-cycle digital data stream, and each signal may be recreated at the far end of the conductors using phase-based decode circuitry.

Figure 4:
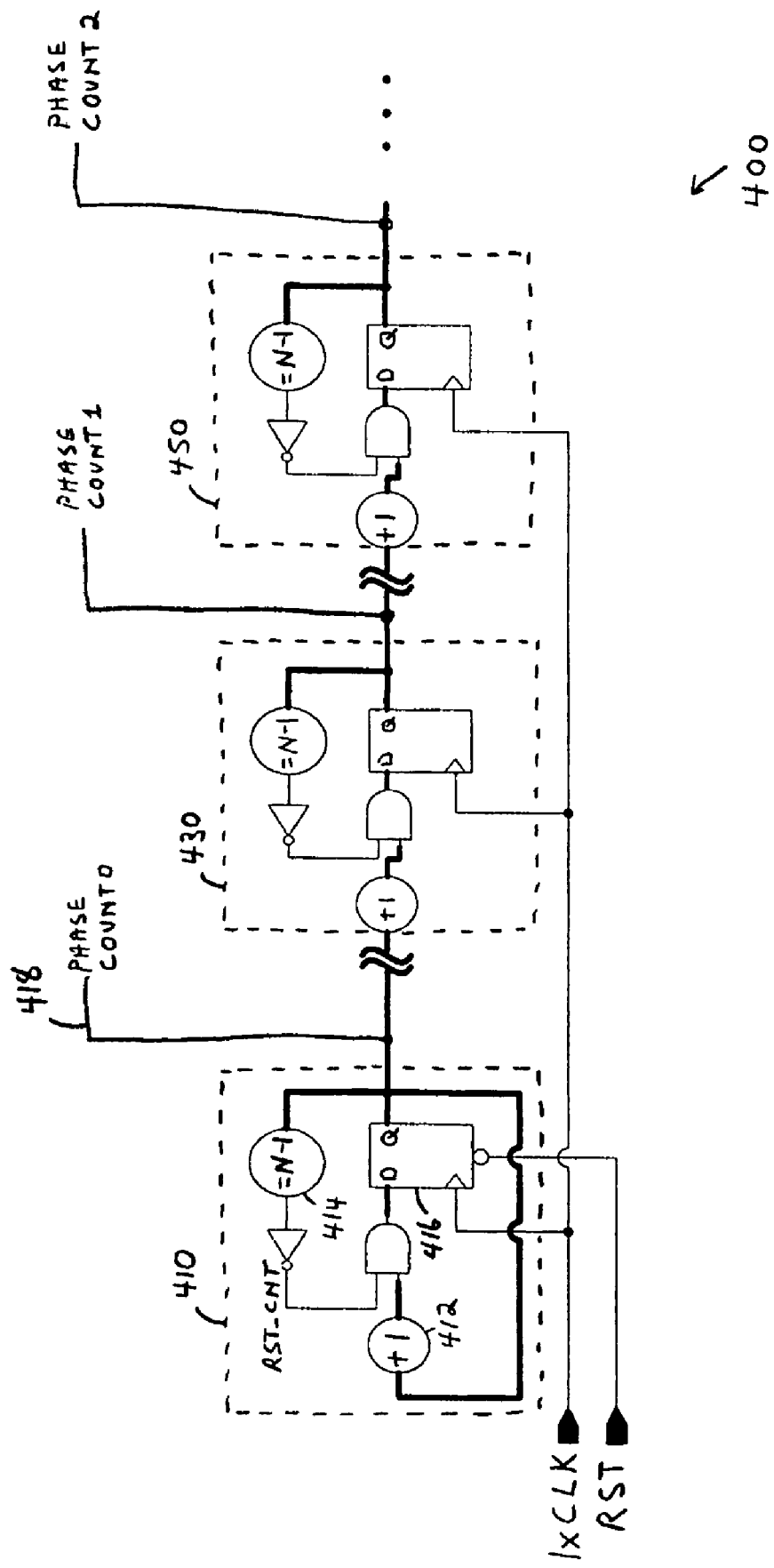
FIG. 4 shows a phase generator in accordance with various embodiments of the present invention.
Figure 5:
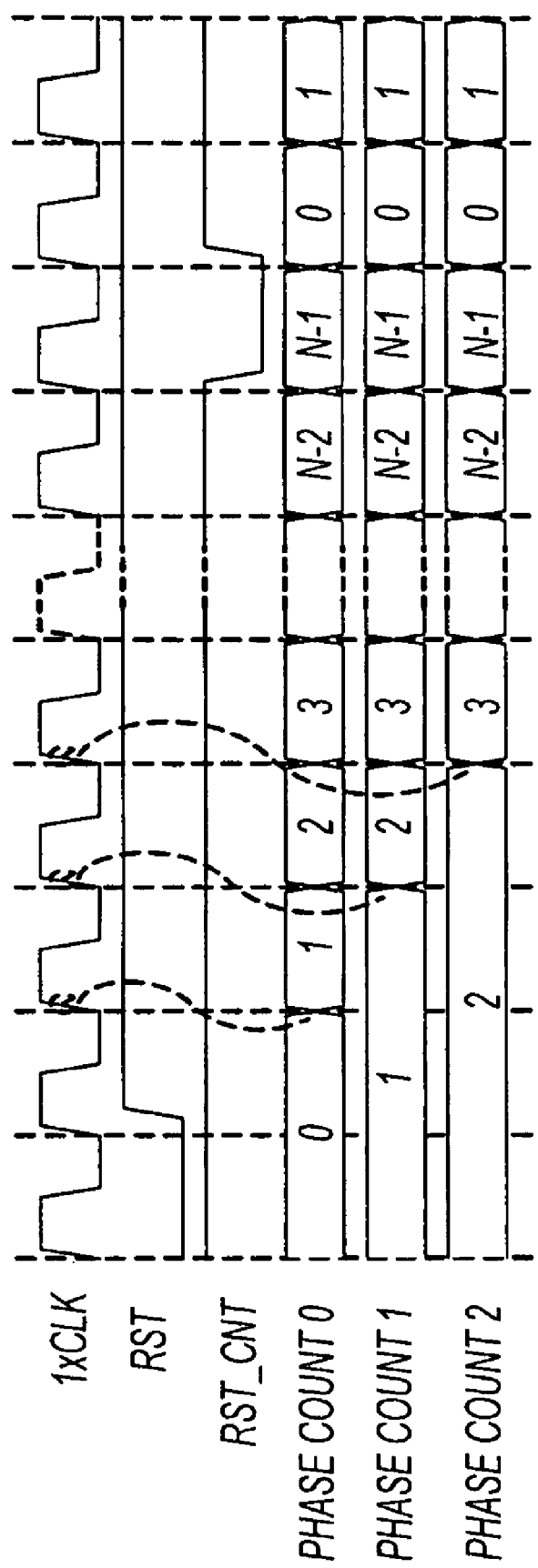
FIG. 5 is a timing diagram showing the operation of the phase generator of FIG. 4.

FIG. 4 shows a phase generator in accordance with various embodiments of the present invention, and FIG. 5 is a timing diagram showing its operation. Phase generator 400 may be utilized as phase generator 330 in circuit 300 (FIG. 3). Phase generator 400 includes multiple stages, shown as 410, 430, and 450 in FIG. 4. Phase generator 400 may include any number of stages, and is not limited to three as shown in FIG. 4.

Phase generator 400 maintains the phase count that is provided to phase-based signal insertion circuits and phase-based decode circuits across a portion or all of an integrated circuit. The phase count is provided to different circuits in the form of "PHASE COUNTx" signals, where "x" can be from 0 to M−1, where the phase generator has M stages. As shown in FIG. 5, there is a startup transient while all stages are starting up, but after the transient passes, all phase count signals provide the same phase count information across the integrated circuit.

Stage 410 includes sequential element 416, adder 412, comparator 414, and other logic. Sequential element 416 is a register that holds multiple bits of digital information to keep track of the phase count value. When the reset signal RST is de-asserted, register 416 will have a value of zero which is driven on node 418 to provide the signal shown as PHASE COUNT 0. Stage 410 counts up at a rate dictated by clock signal 1xCLK until a value of "N−1" is reached, at which point register 416 is reset back to zero. Accordingly, stage 410 produces a phase count that counts between zero and "N−1" repeatedly, and this data is produced on 418 as PHASE COUNT 0.

Stages 430 and 450 also include adders, comparators, and registers. Stages 430 and 450 may be concatenated, and distributed about the integrated circuit die. Each of stages 430 and 450 produce a phase count output signal that is synchronized to the phase count represented by PHASE COUNT 0. In various embodiments of the present invention, many additional stages similar to stages 430 and 450 are concatenated to distribute synchronized phase count signals about the integrated circuit. These phase count signals may then be provided to phase-based signal insertion circuits and phase-based signal decode circuits to reliably de-multiplex digital data streams onto parallel conductors, and to reliably recreate the original digital data stream at the far end of the conductors.

Figure 6:
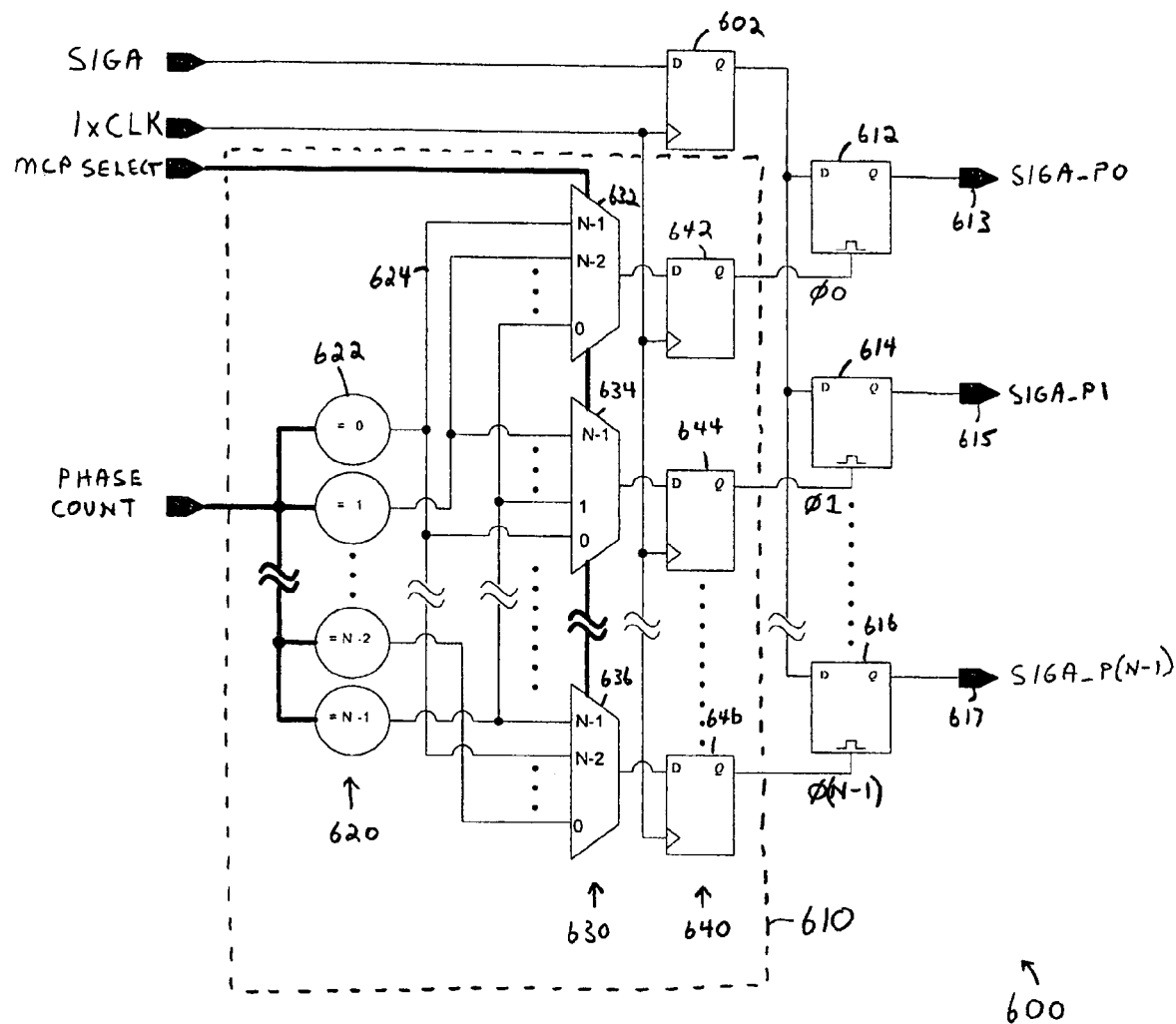
FIG. 6 shows a phase-based signal insertion circuit in accordance with various embodiments of the present invention.

FIG. 6 shows a phase-based signal insertion circuit in accordance with various embodiments of the present invention. Phase-based signal insertion circuit 600 may be used as phase-based signal insertion circuit 310 (FIG. 3). Phase-based signal insertion circuit 600 includes sequential elements 602, 612, 614, and 616. Sequential elements 612, 614, and 616 form an output circuit to drive a different subset of the digital data on each of the plurality of signal conductors 613, 615, and 617. For example, a digital data stream SIGA is received, and the output circuit drives a different subset of SIGA on each of SIGA_P0 to SIGA_P(N−1).

Phase-based signal insertion circuit 600 also includes phase control signal generator 610. Sequential element 602 is shown as a flip flop clocked by clock signal 1xCLK, and sequential elements 612, 614, and 616 are shown as latches controlled by signals Φ0, Φ1, and Φ(N−1) output from phase control signal generator 610. Accordingly, the timing of the multi-cycle data signals output from phase-based signal insertion circuit 600 is influenced by the phase control signal generator 610 and the signals input thereto.

Phase control signal generator 610 receives the phase count and configuration information in the form, of the multi-cycle program (MCP) select signal, and generates phase control signals Φ0 to Φ(N−1). The phase control signals have a phase relationship that is responsive to a logical combination of the configuration information and the phase count. Phase control signal generator 610 includes comparators shown generally at 620, multiplexers shown generally at 630, and output flip flops shown generally at 640. Multiplexers 630 are controlled by the multi-cycle program (MCP) select signal. The MCP select signal may be provided by a configuration register such as configuration register 340 (FIG. 3). In some embodiments, this configuration information is held static such that each of multiplexers 632, 634, and 636 consistently select the same input signal to provide to the appropriate output flip flop.

Phase control signal generator 610 also receives one of the PHASE COUNT signals from the phase generator. The PHASE COUNT signal is input to comparators 620, which then assert signals input to multiplexers 630 based on the current phase count value. For example, comparator 622 compares the value of the phase count with the value of zero. When the phase count equals zero, node 624 is asserted. Further, node 624 is coupled to a separate input of each of multiplexers 630. Accordingly, one of multiplexers 630 will have an asserted output when the phase count equals zero. Similarly, when the phase count equals one, one of the multiplexers will have an asserted output, and this pattern continues for each value of the phase count. The phase of the phase control signals is rotated by modifying the MCP select signal. In some embodiments, the value of the MCP select signal is controllable using bits in a configuration register. In these embodiments, the phase relationship of the phase control signals that control sequential elements 612, 614, and 616 may be modified by modifying bits in a configuration register.

In some embodiments, phase-based signal insertion circuit 600 does not include phase control signal generation circuit 610. In these embodiments, the phase control signals controlling the phase relationships of the multi-cycle signals have a fixed relationship based on the value of the phase count. Further, in these embodiments, a circuit similar to phase control signal generation circuit 610 may be included in the corresponding phase-based signal decode circuit which receives the multi-cycle signals output as shown in FIG. 6.

Figure 7:
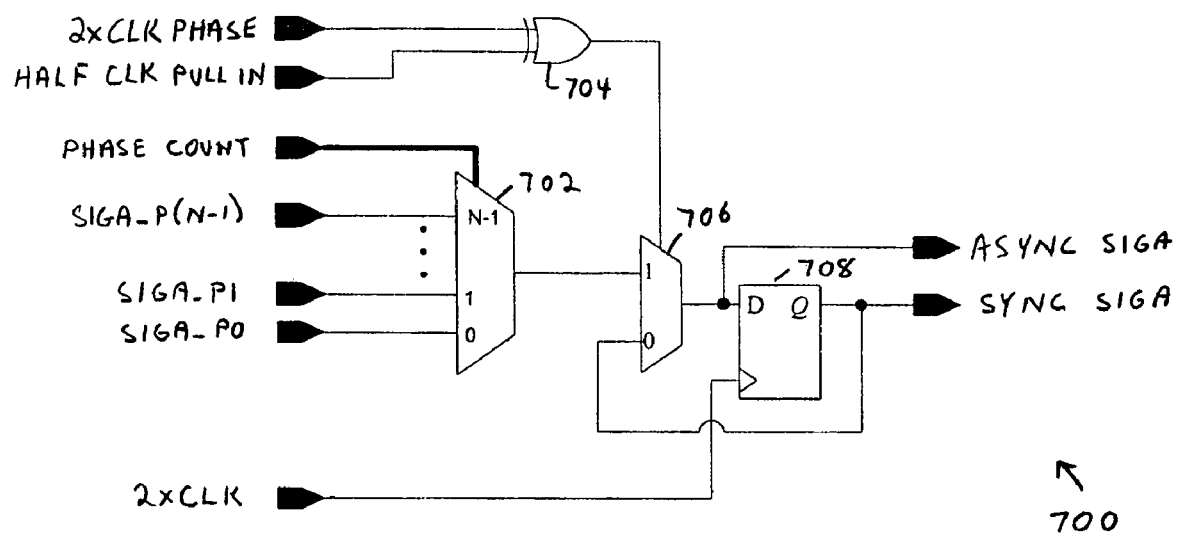
FIG. 7 shows a phase-based signal decode circuit.

FIG. 7 shows a phase-based signal decode circuit. Phase-based signal decode circuit 700 may be used as phase-based signal decode circuit 320 (FIG. 3). Phase-based signal decode circuit 700 receives the multi-cycle signals and the phase count in a manner similar to multiplexer 230 (FIG. 2). Phase-based signal decode circuit 700 includes multiplexers 702 and 706, logic 704, and sequential element 708. Multiplexer 702 forms an input circuit to receive the multi-cycle signals. The output of multiplexer 702 is input to multiplexer 706 and the output of multiplexer 706 is clocked at sequential element 708 to reproduce the original digital data stream. The sequential element 708 is clocked by a clock signal 2xCLK having a frequency twice that of 1xCLK. Further, multiplexer 706 is controlled by a logical combination of two signals: 2xCLK PHASE and HALF CLK PULL IN. HALF CLK PULL IN may be a signal held in a configuration register such as configuration register 340 (FIG. 3).

Phase-based signal decode circuit 700 recreates the original digital data stream SIGA as described with reference to previous figures. Phase-based signal decode circuit 700 also allows sequential element 708 to clock the digital data with a granularity twice that of the clock frequency of 1xCLK.

Figure 8:
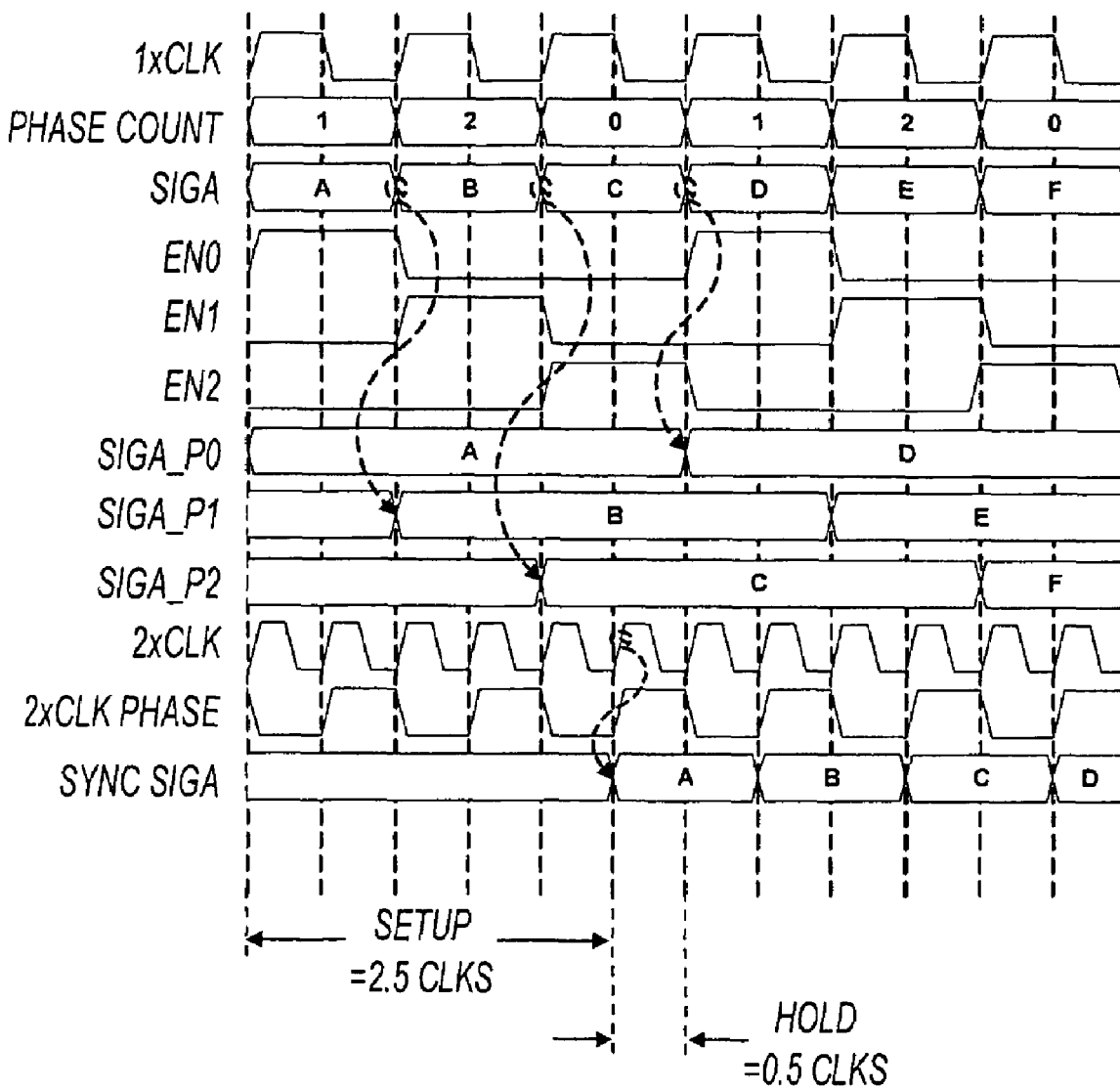
FIGS. 8 and 9 show timing diagrams demonstrating the operation of a programmable multi-cycle signaling system.
Figure 9:
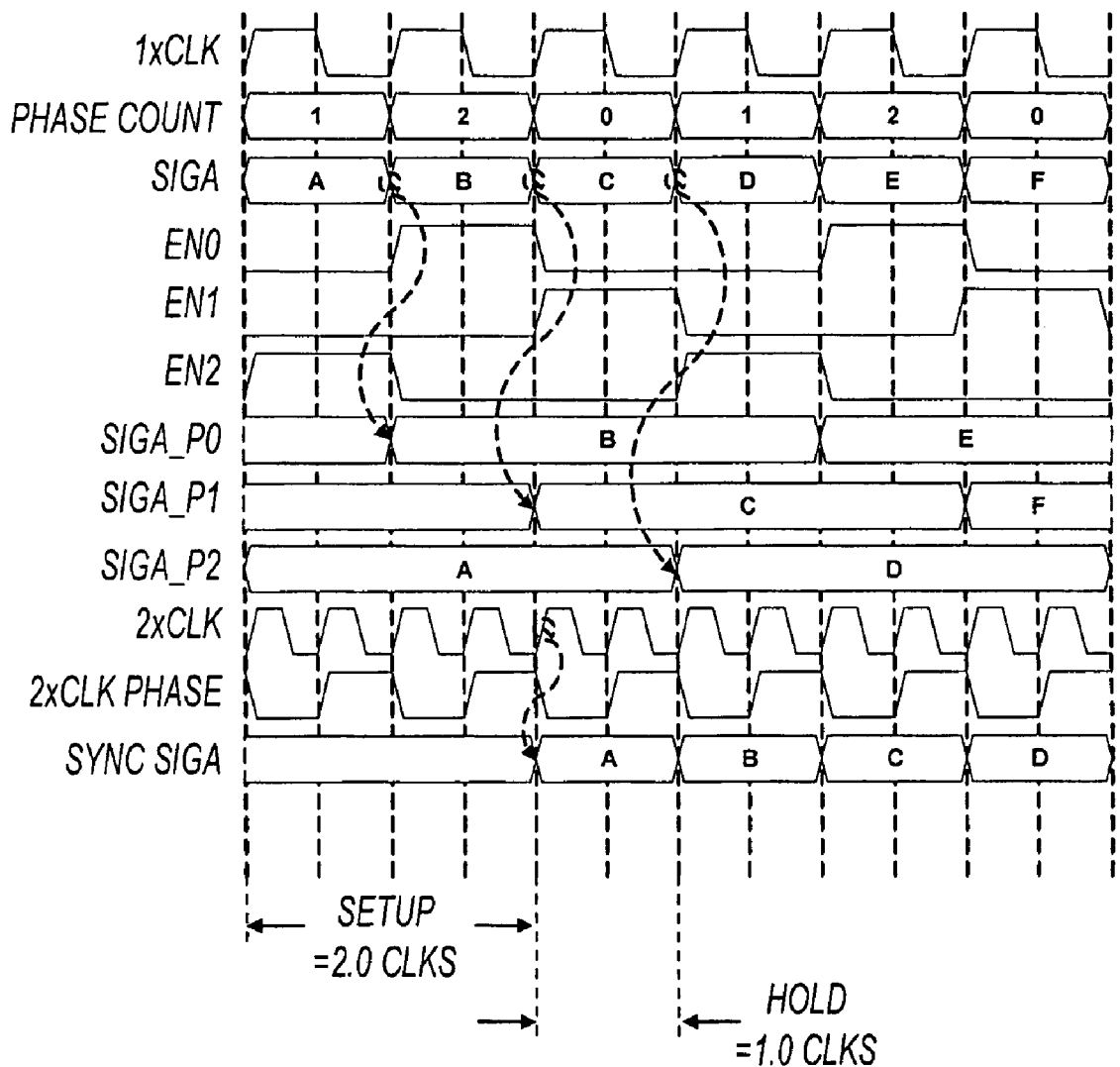

FIGS. 8 and 9 show timing diagrams demonstrating the operation of a programmable multi-cycle signaling system that includes a phase-based signal insertion circuit similar to phase-based signal insertion circuit 600 and a phase-based decode circuit similar to phase-based signal decode circuit 700. In the example described by FIGS. 8 and 9, three parallel conductors are provided, and the period of the multi-cycle signals is three times that of 1xCLK.

In FIG. 8, the combination of the MCP select signal and the HALF CLK PULL IN signal are set to provide a setup time of two and one-half clock periods, and a hold time of one-half clock period. For example, the MCP select is set to provide three clock periods, and the HALF CLK PULL IN signal is asserted to reduce the set up by one-half clock period. To provide three clock periods, the MCP select signal is set to select the third input of multiplexers 630 (FIG. 6) when N=3 (e.g., MCP select=01b).

FIG. 9 shows a system in which the combination of the MCP select signal and HALF CLK PULL IN signal provide a setup time of two clock periods and a hold time of one clock period. For example, the MCP select is set to select the second input of multiplexers 630 (FIG. 6) (e.g., MCP select=10b), and the HALF CLK PULL IN signal is not asserted.

Figure 10:
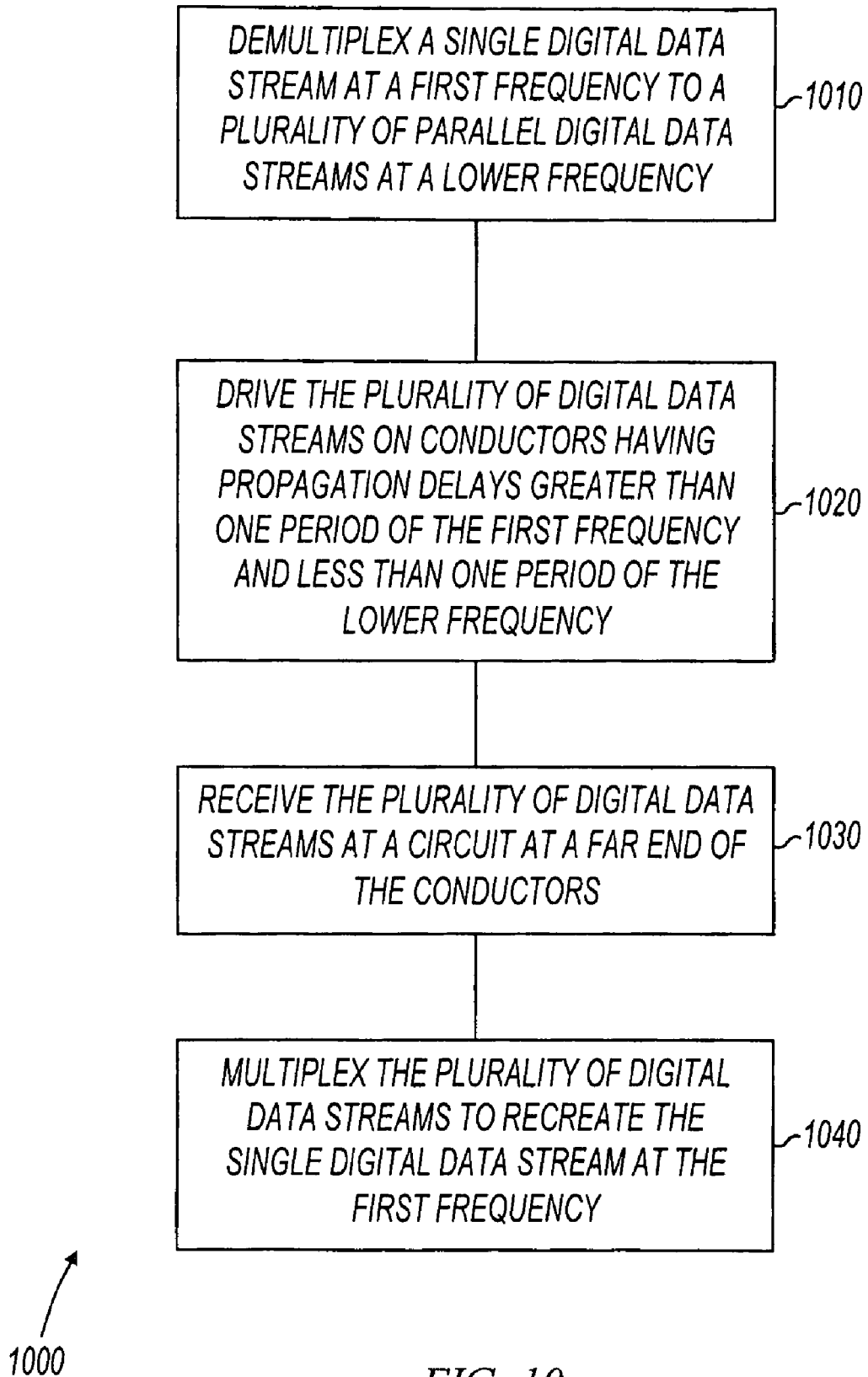
FIG. 10 shows a flowchart in accordance with various embodiments of the present invention.

FIG. 10 shows a flowchart in accordance with various embodiments of the present invention. In some embodiments, method 1000 may be used to perform programmable multi-cycle signaling. Method 1000 is not limited by the particular type of apparatus performing the method. The various actions in method 1000 may be performed in the order presented, or may be performed in a different order. Further, in some embodiments, some actions listed in FIG. 10 are omitted from method 1000.

Method 1000 begins at 1010 in which a single digital data stream at a first frequency is de-multiplexed to a plurality of parallel digital data streams at a lower frequency. For example, as shown in the previous figures, phase-based signal insertion circuits may receive a digital data stream and de-multiplex it onto multiple parallel conductors.

In some embodiments, the single digital data stream is divided into N phases, where N is equal to a number of conductors. Each phase includes a subset of the original data stream. Further, a phase count value may be used to determine which of the N phases to latch on to each conductor. In some embodiments, a combination of static configuration data is logically combined with a phase count value to determine which of the N phases is latched on to each conductor.

At 1020, the plurality of digital data streams are driven on the conductors having propagation delays greater than one period of the first frequency and less than one period of the lower frequency. For example, in the examples described by FIGS. 8 and 9, the lower frequency has a period three times longer than the period of the higher frequency. In these embodiments, the propagation delay on the parallel conductors may be between these two period values.

At 1030, the plurality of digital data streams are received at a circuit at the far end of the conductors. For example, a phase-based decode circuit may receive the plurality of digital data streams. At 1040, the plurality of digital data streams are multiplexed to recreate the single digital data stream at the first frequency. In some embodiments, the decoding may be performed in response to the phase count. Further, in some embodiments, a combination of static configuration data is logically combined with the phase count value to determine the order of decoding.

By utilizing a logical combination of static configuration data with the phase count value to control the timing at either the source end or destination end of the multi-cycle signaling circuit, setup and hold times at the destination end may be programmable.

Figure 11:
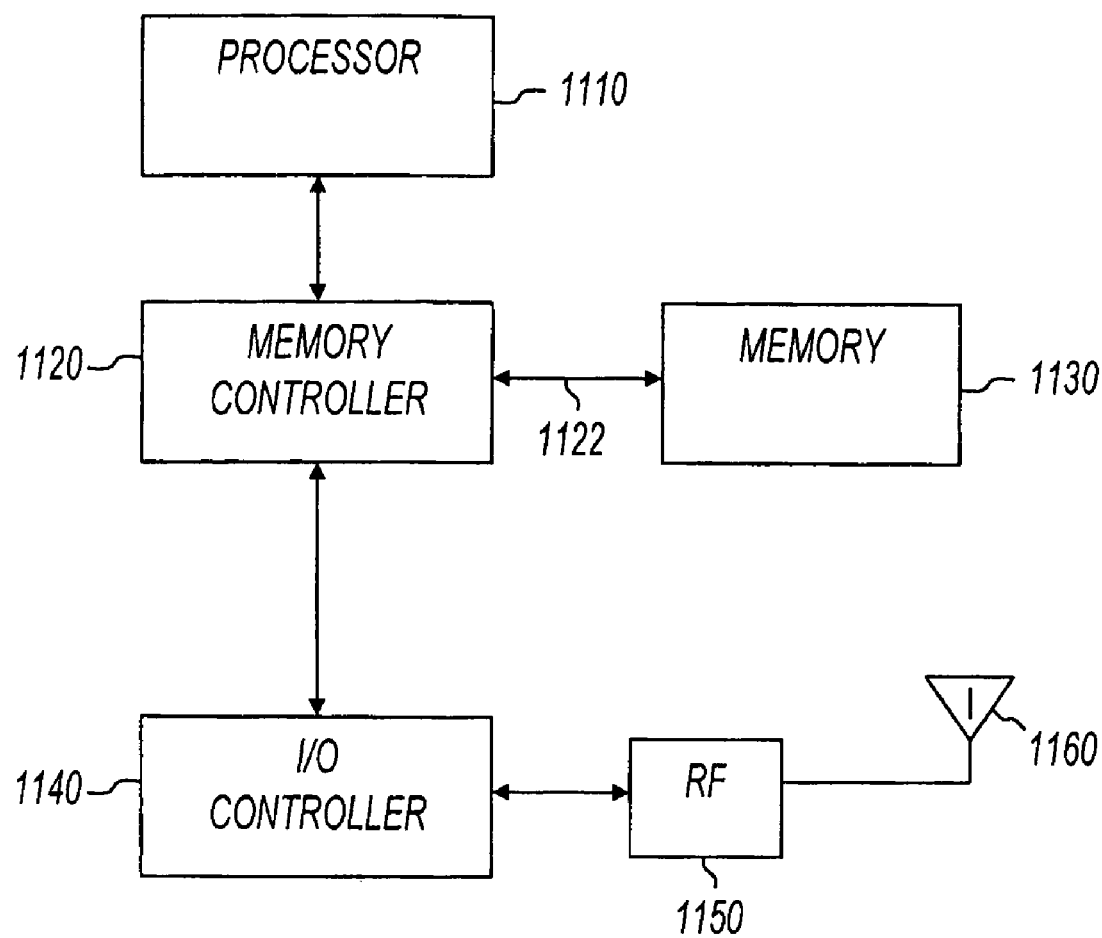
FIGS. 11 and 12 show diagrams of electronic systems in accordance with various embodiments of the present invention.

FIG. 11 shows an electronic system in accordance with various embodiments of the present invention. Electronic system 1100 includes processor 1110, memory controller 1120, memory 1130, input/output (I/O) controller 1140, radio frequency (RF) circuits 1150, and antenna 1160. In operation, system 1100 sends and receives signals using antenna 1160, and these signals are processed by the various elements shown in FIG. 11. Antenna 1160 may be a directional antenna or an omni-directional antenna. As used herein, the term omni-directional antenna refers to any antenna having a substantially uniform pattern in at least one plane. For example, in some embodiments, antenna 1160 may be an omni-directional antenna such as a dipole antenna, or a quarter wave antenna. Also for example, in some embodiments, antenna 1160 may be a directional antenna such as a parabolic dish antenna, a patch antenna, or a Yagi antenna. In some embodiments, antenna 1160 may include multiple physical antennas.

Radio frequency circuit 1150 communicates with antenna 1160 and I/O controller 1140. In some embodiments, RF circuit 1150 includes a physical interface (PHY) corresponding to a communications protocol. For example, RF circuit 1150 may include modulators, demodulators, mixers, frequency synthesizers, low noise amplifiers, power amplifiers, and the like. In some embodiments, RF circuit 1150 may include a heterodyne receiver, and in other embodiments, RF circuit 1150 may include a direct conversion receiver. In some embodiments, RF circuit 1150 may include multiple receivers. For example, in embodiments with multiple antennas 1160, each antenna may be coupled to a corresponding receiver. In operation, RF circuit 1150 receives communications signals from antenna 1160, and provides analog or digital signals to I/O controller 1140. Further, I/O controller 1140 may provide signals to RF circuit 1150, which operates on the signals and then transmits them to antenna 1160.

Processor 1110 may be any type of processing device. For example, processor 1110 may be a microprocessor, a microcontroller, or the like. Further, processor 1110 may include any number of processing cores, or may include any number of separate processors.

Memory controller 1120 provides a communications path between processor 1110 and other devices shown in FIG. 11. In some embodiments, memory controller 1120 is part of a hub device that provides other functions as well. As shown in FIG. 11, memory controller 1120 is coupled to processor 1110, I/O controller 1140, and memory 1130.

Memory 1130 may be any type of memory technology. For example, memory 1130 may be random access memory (RAM), dynamic random access memory (DRAM), static random access memory (SRAM), nonvolatile memory such as FLASH memory, or any other type of memory.

Memory 1130 may represent a single memory device or a number of memory devices on one or more memory modules. Memory controller 1120 provides data through bus 1122 to memory 1130 and receives data from memory 1130 in response to read requests. Commands and/or addresses may be provided to memory 1130 through conductors other than bus 1122 or through bus 1122. Memory controller 1130 may receive data to be stored in memory 1130 from processor 1110 or from another source. Memory controller 1120 may provide the data it receives from memory 1130 to processor 1110 or to another destination. Bus 1122 may be a bi-directional bus or unidirectional bus. Bus 1122 may include many parallel conductors. The signals may be differential or single ended.

Memory controller 1120 is also coupled to I/O controller 1140, and provides a communications path between processor 1110 and I/O controller 1140. I/O controller 1140 includes circuitry for communicating with I/O circuits such as serial ports, parallel ports, universal serial bus (USB) ports, and the like. As shown in FIG. 11, I/O controller 1140 provides a communications path to RF circuits 1150.

Any of the circuits in system 1100 may utilize any of the programmable multi-cycle signaling embodiments described above. For example, memory controller 1120 may include phase-based signal insertion circuits and phase-based decode circuits to communicate synchronously over relatively large distances within the integrated circuit. Further, memory controller 1120 may have one or more configuration registers to hold configuration information such as the MCP select information described above. Processor 1110 may program the MCP select information based on many factors, including the operating frequency of the various components shown in FIG. 11.

Figure 12:
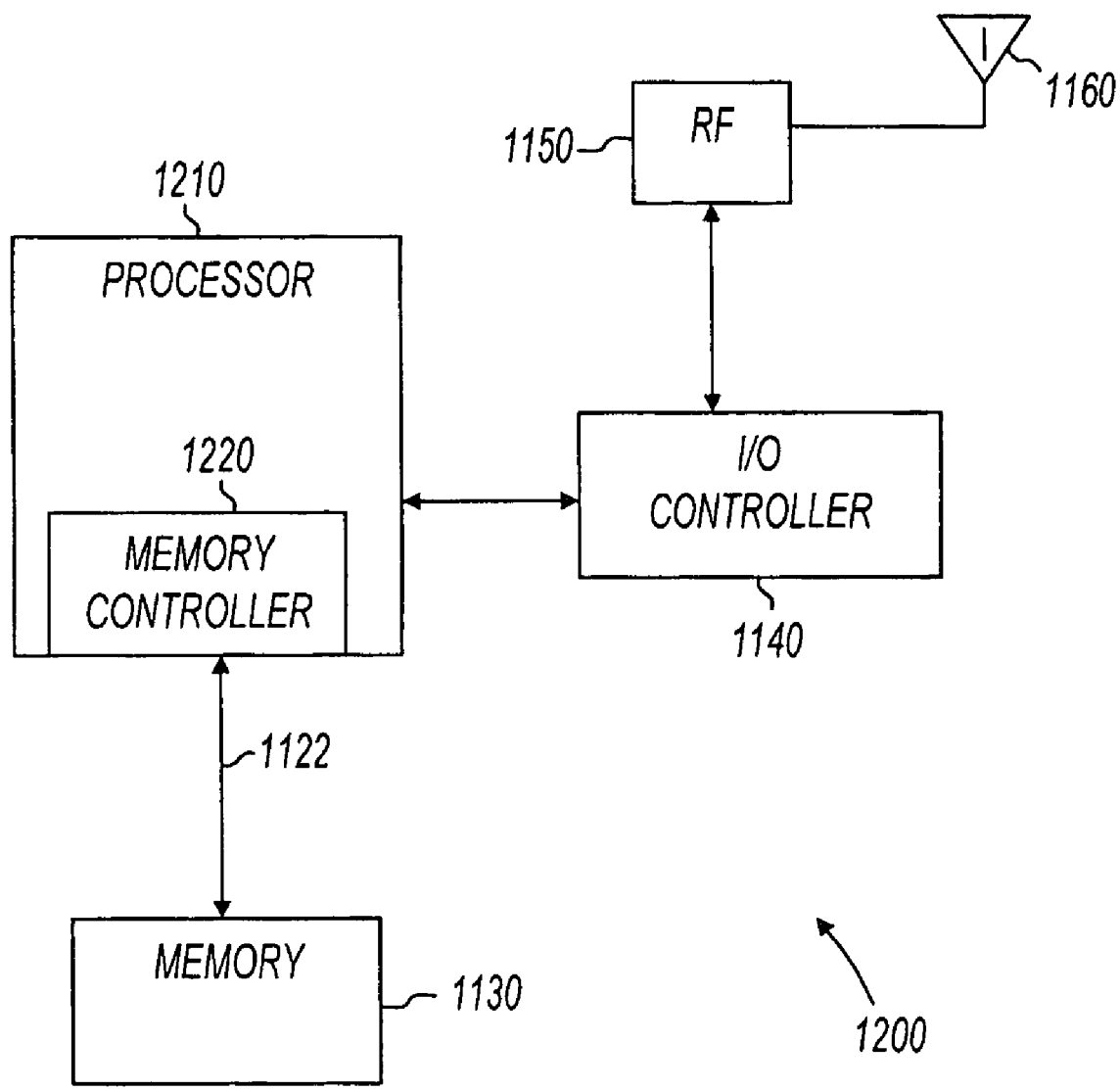

FIG. 12 shows an electronic system in accordance with various embodiments of the present invention. Electronic system 1200 includes memory 1130, I/O controller 1140, RF circuits 1150, and antenna 1160, all of which are described above with reference to FIG. 11. Electronic system 1200 also includes processor 1210 and memory controller 1220. As shown in FIG. 12, memory controller 1220 is included in processor 1210. Processor 1210 may be any type of processor as described above with reference to processor 1110 (FIG. 11). Processor 1210 differs from processor 1110 in that processor 1210 includes memory controller 1220, whereas processor 1110 does not include a memory controller.

Example systems represented by FIGS. 11 and 12 include desktop computers, laptop computers, cellular phones, personal digital assistants, wireless local area network interfaces, or any other suitable system. Many other systems uses for programmable multi-cycle signaling exist. For example, the programmable multi-cycle signaling embodiments described herein may be used in a server computer, a network bridge or router, or any other system with or without an antenna.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An integrated circuit comprising:
   a first digital circuit to source digital data at a first clock frequency;
   a second digital circuit to receive the digital data at the first clock frequency; and
   a plurality of signal conductors coupling the first digital circuit and the second digital circuit;
   wherein the first digital circuit includes output circuitry to drive a different subset of the digital data on each of the plurality of signal conductors at a frequency less than the first clock frequency, and wherein the second digital circuit includes input circuitry to multiplex the plurality of signal conductors back to a single conductor at the first clock frequency, and wherein the first and second digital circuits are spaced far enough apart on the integrated circuit such that a propagation delay on any of the plurality of signal conductors is greater than one clock period at the first clock frequency.

2. The integrated circuit of claim 1 further comprising a phase generator to provide digital count values to the first and second digital circuits, wherein a total number of digital count values is equal in number to a quantity of signal conductors in the plurality of signal conductors.

3. The integrated circuit of claim 2 wherein the phase generator comprises a plurality of adder circuits distributed about the integrated circuit.

4. The integrated circuit of claim 2 wherein the output circuitry of the first digital circuit is responsive to a logical combination of a configuration word and the digital count value from the phase signal generator to determine which subset of the digital data is driven on each of the plurality of conductors.

5. The integrated circuit of claim 4 wherein the input circuitry is responsive to the digital count value from the phase signal generator to determine multiplexer timing used to multiplex the plurality of signal conductors back to a single conductor at the first clock frequency.

6. The integrated circuit of claim 4 wherein the configuration word signifies a frequency value of the first clock frequency.

7. The integrated circuit of claim 4 wherein the input circuitry of the second digital circuit further comprises:
   a synchronous element operating at twice the first clock frequency; and
   logic to allow the synchronous element to clock the digital data with a granularity twice that of the first clock frequency.

8. The integrated circuit of claim 2 wherein the input circuitry is responsive to a logical combination of a configuration word and the digital count value from the phase signal generator to determine multiplexer timing used to multiplex the plurality of signal conductors back to a single conductor at the first clock frequency.

9. A method comprising:
   de-multiplexing a single digital data stream at a first frequency to a plurality of parallel digital data streams at a lower frequency;
   driving the plurality of digital data streams onto conductors having propagation delays greater than one period of the first frequency and less than one period of the lower frequency;
   receiving the plurality of digital data streams at a circuit at a far end of the conductors; and
   multiplexing the plurality of digital data streams to recreate the single digital data stream at the first frequency.

10. The method of claim 9 wherein the single data stream is divided into N phases, where N is the number of conductors, the method further comprising determining which of the N phases of the single digital data stream to latch on each conductor based on a count value that counts through N values.

11. The method of claim 10 further comprising determining which of the N phases of the single digital data stream to latch on each conductor based on a logical combination of the count value and a configuration word.

12. The method of claim 11 wherein multiplexing comprises multiplexing the plurality of digital data streams based on the count value.

13. The method of claim 10 wherein multiplexing comprises multiplexing the plurality of digital data streams based on a logical combination of the count value and a configuration word.

14. A system comprising:
   an antenna;
   radio frequency circuit coupled to the antenna; and
   an integrated circuit coupled to the radio frequency circuit, the integrated circuit comprising a first digital circuit to source digital data at a first clock frequency, a second digital circuit to receive the digital data at the first clock frequency, and a plurality of signal conductors coupling the first digital circuit and the second digital circuit, wherein the first digital circuit includes output circuitry to drive a different subset of the digital data on each of the plurality of signal conductors at a frequency less than the first clock frequency, and wherein the second digital circuit includes input circuitry to multiplex the plurality of signal conductors back to a single conductor at the first clock frequency.

15. The system of claim 14 wherein the first and second digital circuits are spaced far enough apart on the integrated circuit such that a propagation delay on any of the plurality of signal conductors is greater than one clock period at the first clock frequency.

16. The system of claim 15 wherein the integrated circuit further comprises a phase generator to provide digital count values to the first and second digital circuits, wherein a total number of digital count values is equal in number to a quantity of signal conductors in the plurality of signal conductors.

17. The system of claim 16 wherein the phase signal generator comprises a plurality of adder circuits distributed about the integrated circuit.

18. The system of claim 16 wherein the output circuitry of the first digital circuit is responsive to a logical combination of a configuration word and the digital count value from the phase generator to determine which subset of the digital data is driven on each of the plurality of conductors.

19. The system of claim 18 wherein the input circuitry is responsive to the digital count value from the phase signal generator to determine multiplexer timing used to multiplex the plurality of signal conductors back to a single conductor at the first clock frequency.

20. An integrated circuit comprising:
    a first digital circuit to source digital data at a first data rate;
    a second digital circuit to receive the digital data, the first digital circuit and the second digital circuit being spaced more than one propagation delay apart at the first data rate; and
    a plurality of signal conductors coupling the first and second digital circuits;
    wherein the first digital circuit includes output demultiplexing circuitry to source a subset of the digital data on each of the plurality of signal conductors at a frequency lower than the first data rate, and wherein the second digital circuit includes input multiplexing circuitry.

21. The integrated circuit of claim 20 further comprising a phase generator to provide digital count values to the first and second digital circuits, wherein a total number of digital count values is equal in number to a quantity of signal conductors in the plurality of signal conductors.

22. The integrated circuit of claim 21 wherein the phase generator comprises a plurality of adder circuits distributed about the integrated circuit.

23. The integrated circuit of claim 21 wherein the output demultiplexing circuitry of the first digital circuit is responsive to a logical combination of a configuration word and the digital count value from the phase signal generator to determine which subset of the digital data is driven on each of the plurality of conductors.

24. The integrated circuit of claim 23 wherein the input multiplexing circuitry is responsive to the digital count value from the phase signal generator to determine multiplexer timing used to multiplex the plurality of signal conductors back to a single conductor at the first data rate.

* * * * *